United States Patent [19]
Park et al.

[11] Patent Number: 5,966,326
[45] Date of Patent: Oct. 12, 1999

[54] NONVOLATILE SEMICONDUCTOR MEMORY EQUIPPED WITH SINGLE BIT AND MULTI-BIT CELLS

[75] Inventors: Jong-wook Park, Seoul; Kang-deok Seo, Kyunggi-do, both of Rep. of Korea

[73] Assignee: Samsung Electronics, Co., Ltd., Suwon, Rep. of Korea

[21] Appl. No.: 08/928,121

[22] Filed: Sep. 12, 1997

[30] Foreign Application Priority Data

Sep. 13, 1996 [KR] Rep. of Korea ................. 96/39904

[51] Int. Cl.$^6$ ................................................. G11C 16/04
[52] U.S. Cl. .......................... 365/185.11; 365/185.12; 365/185.03
[58] Field of Search .................... 365/185.11, 185.12, 365/185.03, 185.17

[56] References Cited

U.S. PATENT DOCUMENTS

| | | |
|---|---|---|
| 5,557,567 | 9/1996 | Bergemont et al. ........... 365/185.03 X |
| 5,587,949 | 12/1996 | Bergemont et al. ........... 365/185.03 X |
| 5,625,590 | 4/1997 | Choi et al. .................... 365/185.11 X |
| 5,671,178 | 9/1997 | Park et al. .................... 365/185.12 X |
| 5,754,469 | 5/1998 | Hung et al. .................... 365/185.12 X |

*Primary Examiner*—Huan Hoang
*Attorney, Agent, or Firm*—Marger Johnson & McCollom, P.C.

[57] ABSTRACT

A nonvolatile semiconductor memory having a single bit cell array and a multi-bit cell array formed on a substrate of the memory is provided. The memory includes a plurality of memory blocks that correspond to the input/output lines and is divided into a plurality of pages. A plurality of bit lines of the single bit cell array is coupled to a plurality of page buffers. The multi-bit cell array includes a plurality of memory blocks in which one of the blocks corresponds to a plurality of the input/output lines and is divided into a plurality of pages. A plurality of bit lines of the multi-bit cell array is coupled to a plurality of page buffers, A timing controller arranges the processing operations in the two arrays.

11 Claims, 5 Drawing Sheets

NONVOLATILE SEMICONDUCTOR MEMORY EQUIPPED WITH SINGLE BIT AND MULTI-BIT CELLS

FIELD OF THE INVENTION

The invention relates to nonvolatile semiconductor memories and, more particularly, to a flash EEPROM (Electrically Erasable and Programmable ROM) employing single bit and multi-bit cell arrays.

BACKGROUND OF THE INVENTION

High density nonvolatile memories, specifically flash EEPROMs, are currently considered as mass storage devices (or medias) for portable handy terminals such as digital still cameras and memory cards, and also for hard disks in personal computers, because of their advanced performance that comes from higher programming speed and lower power consumption. The flash memory is distinguished into two types of logical configurations, NAND and NOR. The NOR-type, in which each of memory cells is connected to its corresponding word line and bit line without being dependent upon adjacent memory cells, needs more contacts for coupling bit lines and memory cells than that of the NAND-type which is superior to the NOR-typed in integration density. In the NAND-type flash memory, each string containing plural memory cells is connected to a corresponding bit line only through one contact, whereas memory cells of the NOR-type are each coupled to a bit line.

In an ongoing effort for efficient integration density for more expanded memory capacity there has been development of multi-bit (multi-level, multi-state, or multiple bit) technology where a plurality of bits are stored in one memory cell. It is acknowledged that the multi-bit technology contributes to reduction of the cost per bit. A prior multi-bit configuration has been disclosed on pp. 132–133 of ISSC Digest of Technical Paper dated Feb. 1995, entitled "A Multilevel-Cell 32Mb Flash Memory" by M. Bauer et al., in which a cell array is arranged in the NOR-type and a memory cell stores one of four states with two bits such as "00", "01", "10" and "11". Each of the four states corresponds to a unique voltage level, e.g., "00"=2.5 V, "01"=1.5 V, "10"=0.5 V and "11"=–3 V. The voltage values are threshold voltages involved in reading out data from the memory cell storing one of the four states of data. Substantially, one memory cell contains a distribution profile corresponding to the plural states of threshold voltages and memory cells coupled to one word line have different threshold voltages each other.

To detect the state of a memory cell, a read voltage with voltage level interposed between threshold voltage levels (or positioned on a lower side or a higher side from the level of a threshold voltage) must be applied to gates of memory cells through a word line coupled in common thereto. In this situation, the width between adjacent threshold voltages (hereinafter referred to as "window") is less than in a normal flash memory. For example, the window in a four-state flash memory is about 0.6 V. Furthermore, when a word line voltage for reading is located in the window of about 0.6 V, the margin from an edge of the threshold voltage profile and the level of the word line voltage may be not more than about 0.3 V. Therefore, if a multi-bit flash memory is made with the accompanying variations of manufacturing process or influenced by variations in word line voltage level and temperature, the possibility of invalid sensing operations is increased. Such weak immunity against variations of external conditions reduces the utility of the multi-bit flash memory to a storage device for mass information such as audio data, where even failure for storing several data bits does not disturb a sufficient organization of information as a whole. Up to now, normal flash memories are used for storing stable information, such as BIOS (Basic Input/Output System) or fonts.

Even though the advantages of the normal and multi-bit flash memories have been well known, the two different types of flash memories are respectively fabricated on separated semiconductor chips. The prior art aforementioned just performs the alternative one out of single bit and multi-bit operations over the entire memory cells.

SUMMARY OF THE INVENTION

Accordingly, it is an object of the invention to provide a nonvolatile memory embedding both single bit and multi-bit cells therein.

Another object of the invention is to provide a nonvolatile memory capable of practicing a multi-bit data access operation simultaneously with a single bit operation on a single chip.

In order to accomplish these objects, the nonvolatile memory includes both a single bit cell array and a multi-bit cell array formed on a substrate of the memory. The single bit cell has a plurality of memory blocks which correspond to the input/output lines and which are divided into a plurality of pages, a plurality of bit lines of the single bit cell array being coupled to a plurality of page buffers. The multi-bit cell array formed on the same substrate of the memory has a plurality of memory blocks in which one of the blocks corresponds to at least a plurality of the input/output lines and which is divided into a plurality of pages, a plurality of bit lines of the multi-bit cell array being coupled to a plurality of page buffers. A timing controller arranges the processing operations in the two arrays. The present invention makes it possible to use an alternative one of the single bit and multi-bit cell arrays.

DETAILED DESCRIPTION OF THE PREFERRED EMBODIMENT

Figure 1:
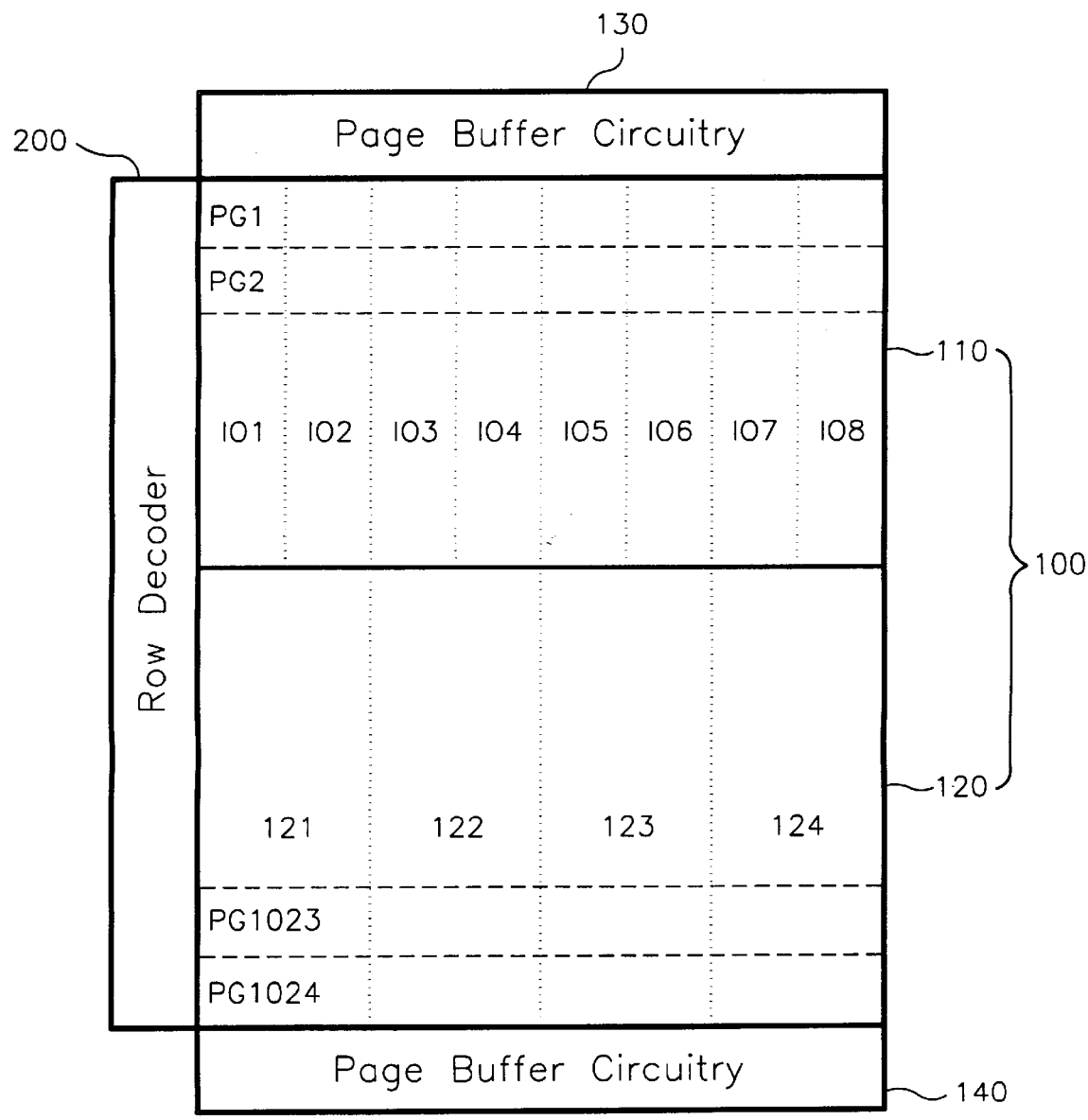
FIG. 1 is a schematic illustrating an architecture of a nonvolatile semiconductor memory according to the invention.

Hereinbelow, applicable embodiments of the invention will be as follows, with the appended drawings. Referring now to the drawings, like reference characters designate like or corresponding parts throughout the several views.

FIG. 1 shows an overall configuration of the memory arrangement according to the invention. Referring to FIG. 1, memory cell array 100 is divided into single bit cell array 110 and multi-bit cell array 120 and is distinguished into a plurality of pages PG1 to PG 1024 arranged along the row direction. Single bit cell array 110 is segmented into eight blocks 101 to 108 while multi-bit cell array 120 into four blocks 121 to 124. The division of the blocks is made up in accordance with an allocation with input/output lines. Namely, blocks 101 to 108 are involved in input/output lines IO1 to IO8. In the multi-bit cell array in need of using two input/output lines, blocks 121 to 124 utilizes IO1 and IO2, IO3 and IO4, IO5 and IO6, and IO7 and IO8, respectively. Row decoder 200 is provided to memory cell array 100 in order to select word lines of single bit and multi-bit cell arrays 110 and 120. Page decoder 130 and 140 are coupled to single bit and multi-bit cell arrays 110 and 120, respectively. Two bit line groups belong respectively to single bit and multi-bit cell arrays are electrically isolated from each other at the border therebetween.

Figure 2:
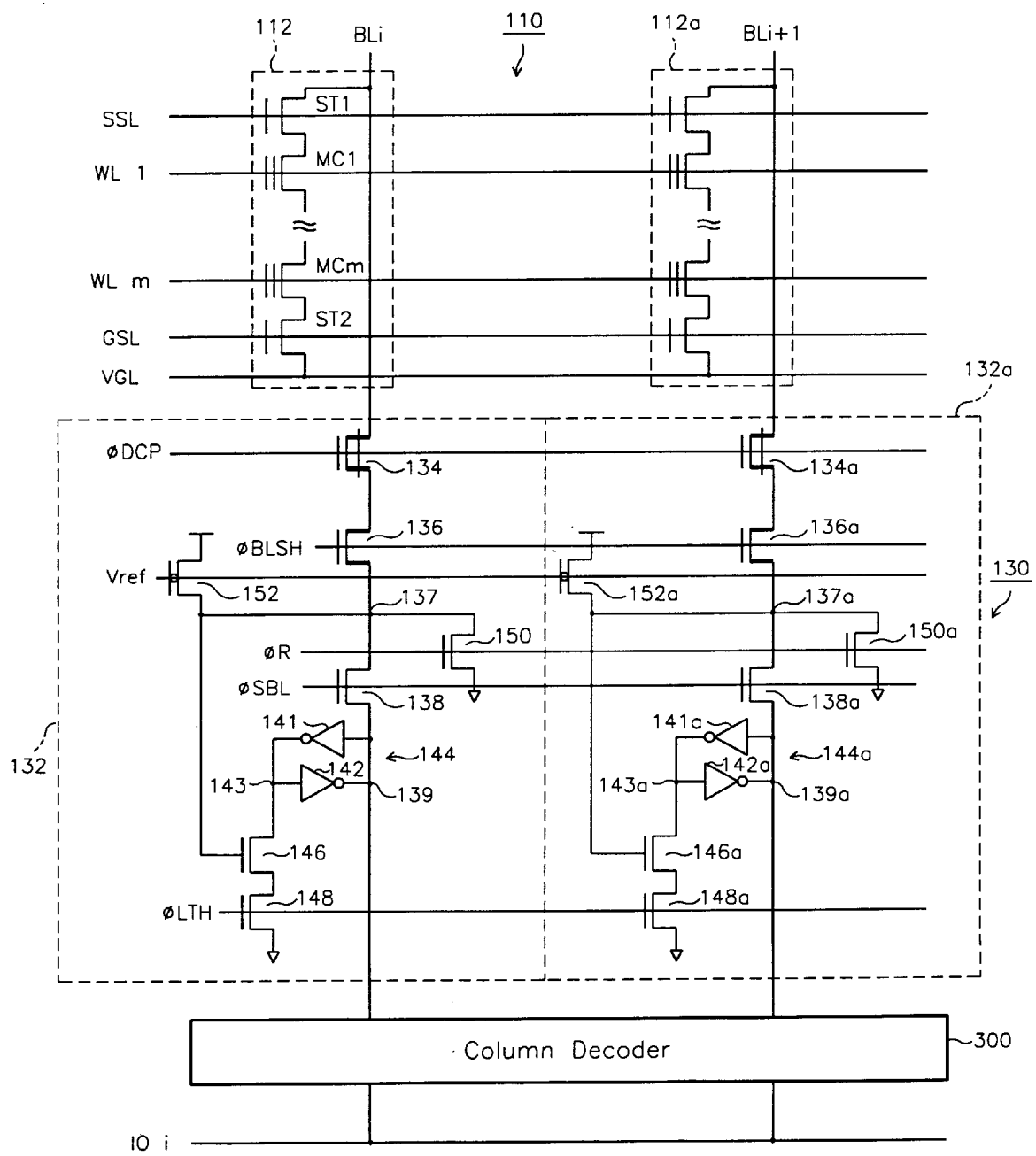
FIG. 2 illustrates a single bit cell array and page buffers of FIG. 1.

Referring to FIG. 2 showing a connecting feature with memory cells and page buffers in the single bit cell array of FIG. 1, memory cells forms the NAND-type arrangement, and two strings 112 and 112a, respectively, are coupled to bit lines BLi and BLi+1 as an example. Note that the configuration of memory cells in FIG. 2 corresponds to one page in the single bit cell array. In string 112 (the same with string 112a), memory cells MC1 to MCM are serially connected between string selection transistor ST1 coupled to bit line BLi and string selection transistor ST2 coupled to virtual ground line VGL. Gates of string and ground selection transistors, ST1 and ST2, are coupled to string and ground selection lines, SSL and GSL, respectively. Gates of memory cells, MCI through MCm, are coupled to word lines WL1 through WLm in turn.

Bit lines BLi and BLi+1 are coupled to their corresponding page buffers 132 and 132a, respectively. Each page buffer has functions of amplifying and latching a data bit for its relevant bit line. In page buffer 132 (the same with page buffer 132a), bit line BLi is connected to column decoder 300 through drain-to-source paths of depletion transistor 134, NMOS transistor 136 and NMOS transistor 138. The gate of depletion transistor 134 is coupled to decoupling signal φDCP. The gates of transistors 136 and 138 are coupled to bit line shielding signal φBLSH and bit line selection signal φSBL, respectively. Between power source voltage and node 137 interposed between transistors 136 and 138, is PMOS transistor 152 with its gate coupled to reference voltage Vref is connected. Latch 144 formed of inverters 141 and 143 is connected between node 139, and is interposed between transistor 138 and column decoder 300, and node 143. From node 143 to a ground, NMOS transistors 146 and 148 are connected in serial. The gate of transistor 146 is coupled to node 137 and the gate of transistor 148 to latch signal φLTH. Components in page buffer 132a equivalently corresponding to those in page buffer 132 are denoted with the suffix "a". And NMOS transistor 150 with gate coupled to reset signal φR is connected between node 137 and the ground. Signals φDCP, φBLSH, φSBL and φLTH are commonly applied to gates of the transistors over the corresponding page. Signals φDCP, φBLSH and φSBL are used for controlling an electrical connection between the bit line and column decoder 300. Transistor 152 applies static current to node 137 during a read operation. Transistor 150 initiates latch 144 prior to reading and transistors 148 activates latch 144 in response to latch signal φLTH of high level. The operation for single bit is well known in the art.

Figure 3:
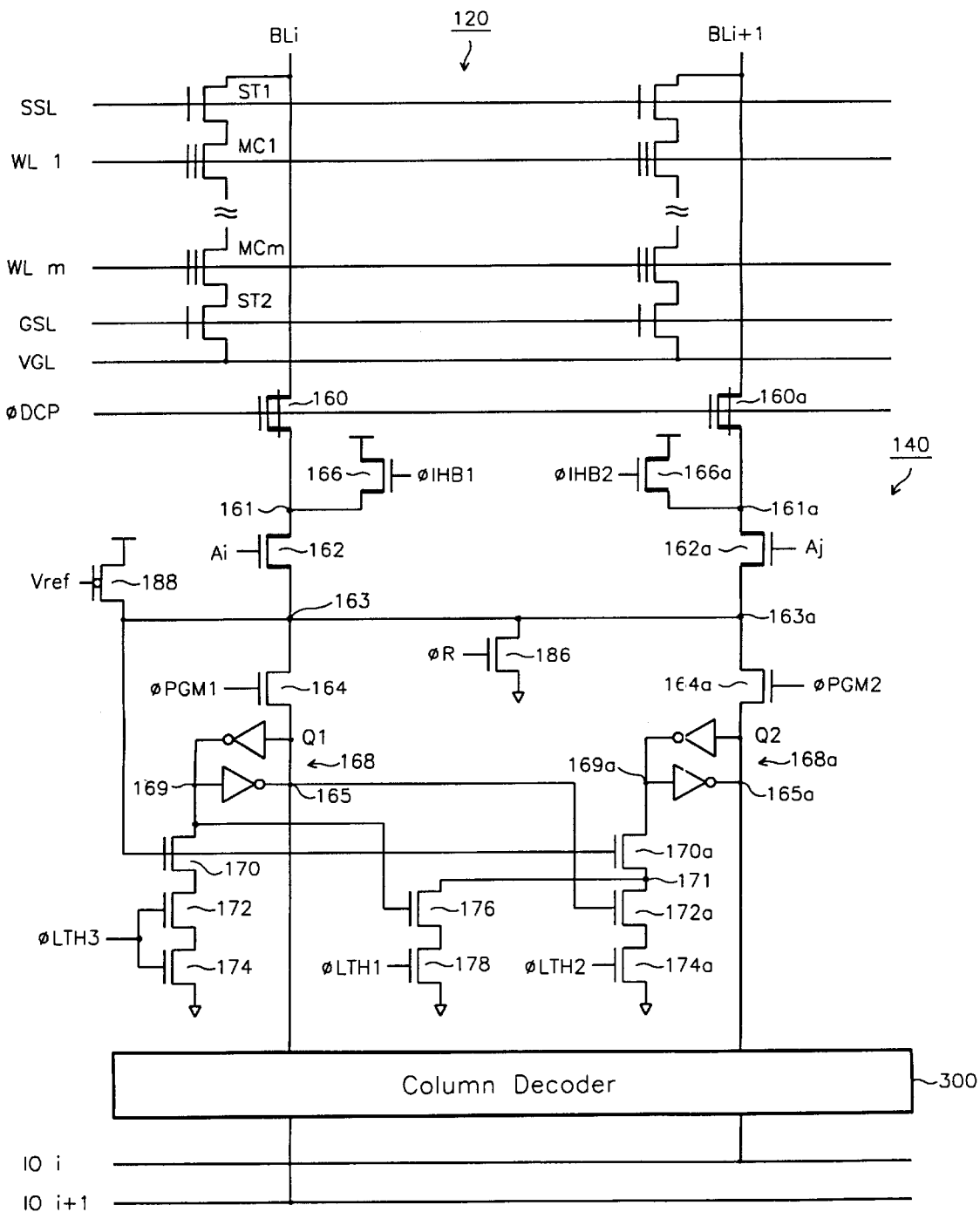
FIG. 3 illustrates a multi-bit cell array and page buffers of FIG. 1.

FIG. 3 shows configurations of the multi-bit cell array and page buffer circuitry. Referring to FIG. 3, the features of memory cells is the same as that of the single bit cell array. Bit line BLi is connected to column decoder 300 through depletion transistor 160, NMOS transistor 162 and NMOS transistor 164. The gate of depletion transistor 160 is coupled to bit line decoupling signal φDCP and the gate of transistor 162 is coupled to address signal Ai. The gate of transistor 164 is coupled to program signal φPGM1. Transistor 166 with its gate coupled to inhibit signal φIHB1 is connected between the power source voltage and node interposed between transistors 160 and 162. The gate of NMOS transistor 162 is coupled to address signal Ai. Between the power source voltage and node 163 and interposed between transistors 162 and 164, PMOS transistor 188 with its gate coupled to reference voltage Vref is connected to supply static current thereto. At node 165 interposed between transistor 164 and column decoder 300, latch 168 is formed of two coupled inverters. Counter node 169 of latch 168 is connected to the ground through transistors 170, 172 and 174. The gate of transistor 170 is coupled to node 163 and the gates of transistors 172 and 174 to latch signal φLTH3 in common.

From bit line BLi+1 adjacent to BLi to column decoder 300, depletion transistor 160a and NMOS transistors 162a and 164a are connected in serial. The gate of depletion transistor 160a is coupled to the decoupling signal φDCP and the gate of NMOS transistor 164a to program signal φPGM2. Transistor 166a with its gate coupled to inhibit signal φIHB2 is connected between the power source voltage and node interposed between transistors 160a and 162a. The gate of NMOS transistor 162a is coupled to address signal Aj. Node 163a interposed between the transistors, 162a and 164a, is directly coupled to the node 163, the two node also being connected to the ground through NMOS transistor 186 with its gate coupled to reset signal φR. At node 165a interposed between transistor 164a and column decoder 300, latch 168a formed of two inverters are coupled. Counter node 169a of latch 168a is connected to the ground through transistors 170a, 172a and 174a. The gate of transistor 170a is coupled to the node 163 (or 163a) together with the gate of the transistor 170 and gate of transistor 172a to the node 165. The gate of transistor 174a is coupled to latch signal φLTH2. In addition, from node 171 between transistors 170a and 172a to the ground, transistors 176 and 178 are connected in serial. The gates of the transistors, 176 and 178, are coupled to the node 169 and latch signal φLTH1, respectively. For accessing multiple bits, the two bit lines correspond to two input/output lines IO1 and IOi+1.

In FIG. 3, transistor 166 (or 166a) supplies a program inhibit voltage to bit line BLi (or BLi+1) when not selected, in response to inhibit signal φHB1 of high level, so that a not selected bit line (e.g., BLi) is prohibited from an undesirable programming while a selected bit line (e.g., BLi+1) is programmed. Transistors 162 and 162a connect bit lines BLi and BLi+1 to their corresponding columns which are led to column decoder 300, in response to address signals Ai and Aj, respectively. Program signals φPGM1 and φPGM2 are disabled only when reset signal φR is activated to initiate latches 168 and 168a.

Figure 4:
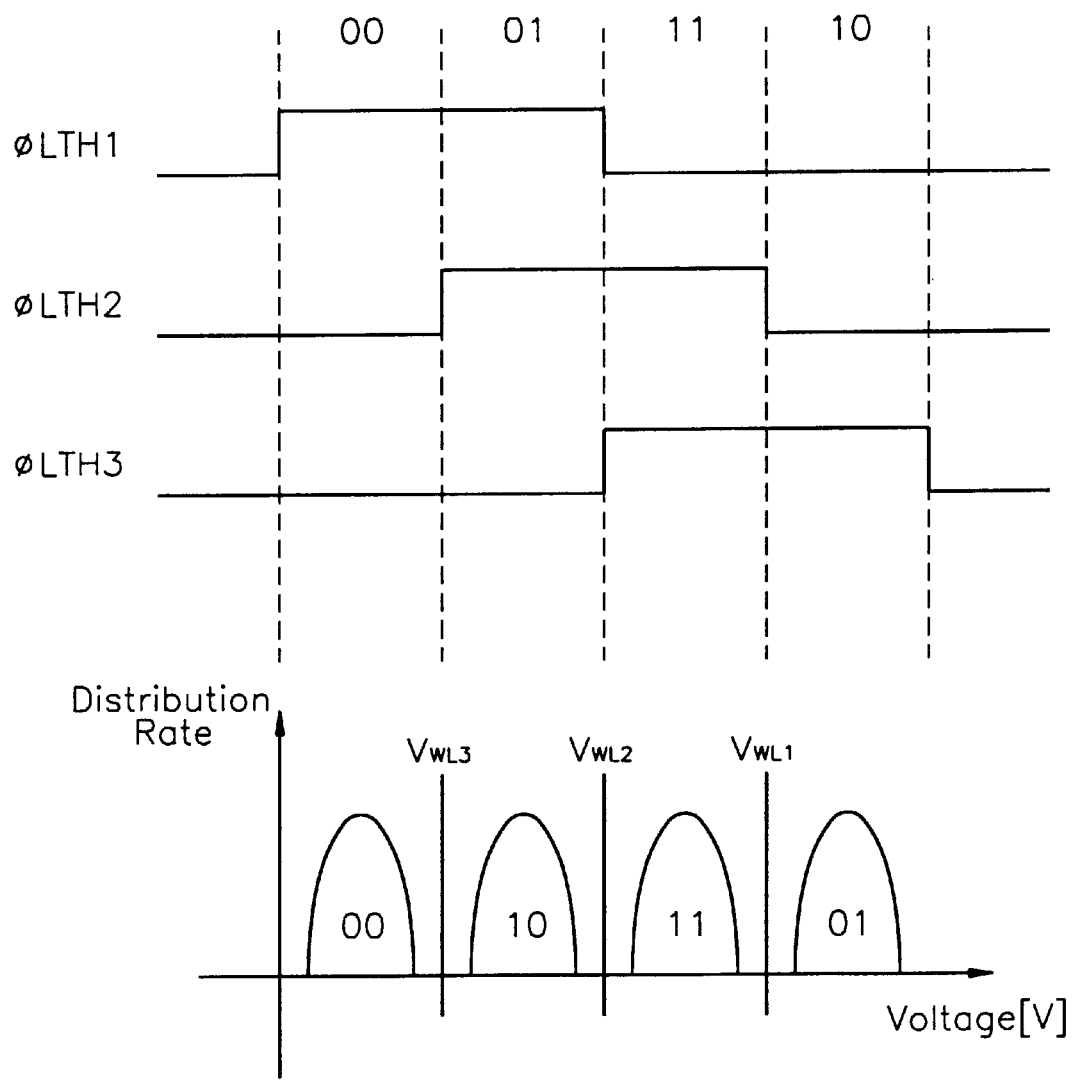
FIG. 4 shows configurations of timings of latch signals for a multi-bit operation, with the relation of threshold voltage profile and word line voltage.

FIG. 4 shows the sequence of reading multiple bits from the cell array 120, in which four stages of two bits, "00", "01", "11" and "10", are subsequently read out by the control of latch signals φLTH1, φLTH2 and φLTH3, and three levels VWL1, VWL2 and VWL3 of the word line voltage are interposed between four stages of the threshold voltage profile. Assume that bit line BLI is selected responding to the activated address signal Ai (Aj is low level). And it should be noted that a voltage applied to a selected word line during a read is step down from the highest level to the lowest level.

First, in order to read the stage "00", that is, in the case that a selected memory cell (e.g., MC1) has the lowest level among the threshold voltage profile aforementioned, φLTH2 and φLTH3 retain low level but φLTH1 is high level. Since, as shown in the graph of FIG. 4, the threshold voltage of "00" is lower that the lowest word line voltage VWL1, node 163 is pulled down to low level to cause node 165 of latch 168 and node 165a of latch 168a to be low level. Second, the reading for "01" is not accomplished until the third word line voltage VWL3 is applied the selected word line (e.g., WL1 for MC1). When VWL3 is lower than the threshold voltage of "01", the selected memory cell is turned-off cells and causes node 163 be changed to high level. Though the voltage of node 163 is high level, the state of node 165 does not change so that φLTH3 is being at low level. However since node 169 of latch 168 becomes high, node 171 is electrically connected to the ground through the path formed of transistors 176 and 178, and thereby node 165a of latch 168a is pulled up to high level. In the case of reading "11", the second word line voltage VWL2 and the charged φLTH3 change node 165 to become high level while there is no variation on node 165a. Finally, just when VWL1 lower than the threshold voltage of "10" is applied to the selected word line, the low-leveled φLTH2 cause node 165a to be pulled down to low level.

Figure 5:
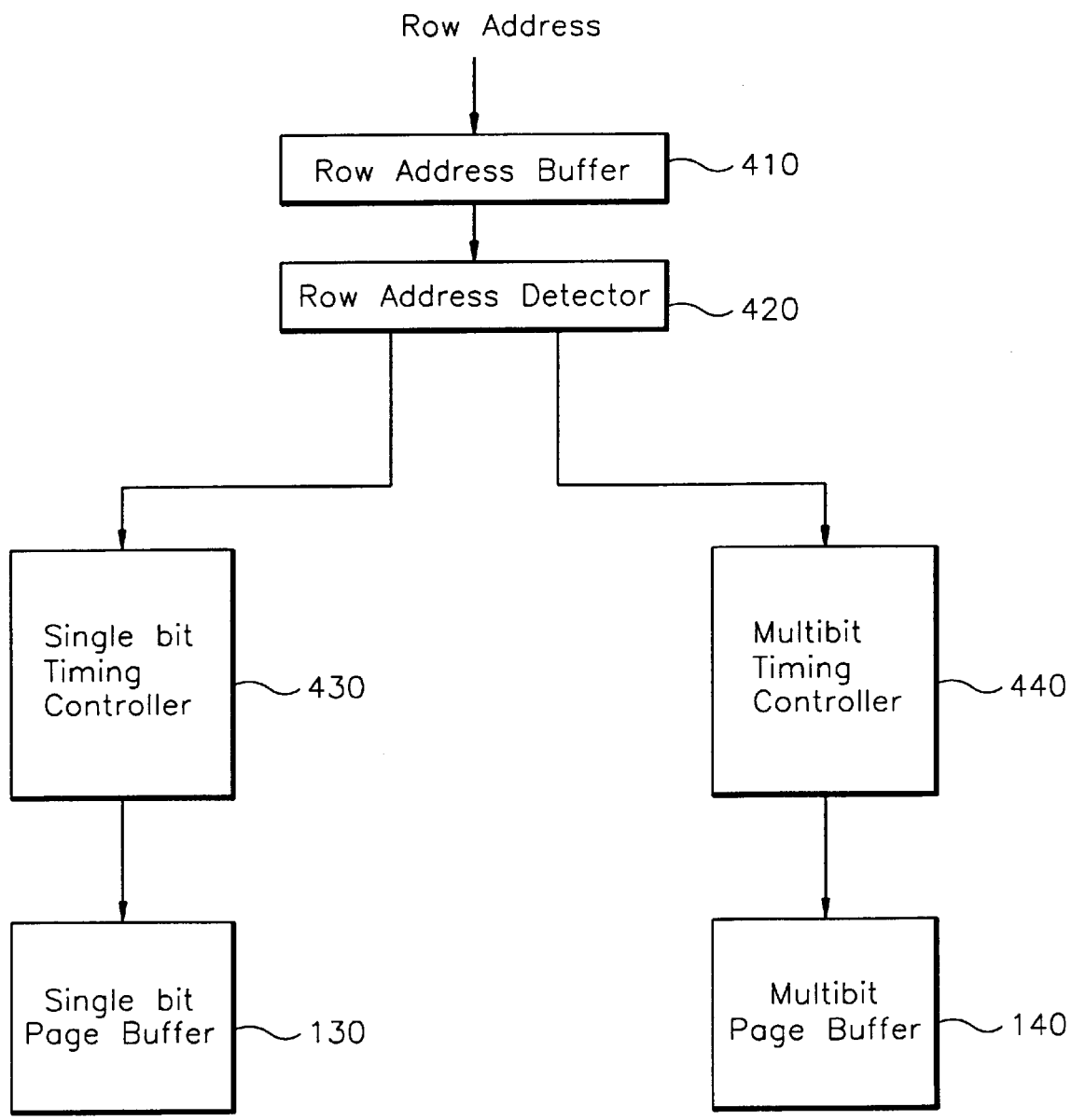
FIG. 5 shows a manner for controlling access timings of single bit and multi-bit.

As aforementioned, since operating manners of the single bit and multi-bit are different from each other, the alternative timing control is used in the present invention as shown in FIG. 5. Referring to FIG. 5, when a row address is generated from row address buffer 410, row address detector 420 determines whether the received row address is for the single bit or for the multi-bit. And then, according to the result from row address detector 420, one of single bit timing controller 430 and multi-bit timing controller 440 is activated. For an example, if the row address is to be used in the multi-bit operation, the multi-bit timing controller 440 controls the timing configuration of the latch signals φLTH1 through φLTH3 to be designed as figured out in FIG. 4. The selection of cell array types and the timing control may be accomplished by using external command.

As discussed above, there is provided a nonvolatile memory capable of employing a single bit cell array and a multi-bit cell array on a chip, so that a flexibility in using data bits of nonvolatile memory is expanded thereof.

While the present invention has been particularly shown and disclosed with reference to the preferred embodiment thereof, it will be appreciable that other embodiments and modification of the invention are possible.

What is claimed is:

1. A nonvolatile memory comprising:
    a plurality of input/output lines;
    a single bit cell array having a plurality of single-bit cell bit lines and a plurality of single-bit memory blocks, each single-bit memory block being coupled to an input/output line and being divided into a plurality of single-bit cell pages having a plurality of single-bit cell page buffers, the plurality of single-bit cell bit lines being coupled to the plurality of single-bit cell page buffers; and
    a multi-bit cell array having a plurality of multi-bit cell bit lines and a plurality of multi-bit cell memory blocks, each multi-bit cell memory block being coupled to one or more input/output lines and being divided into a plurality of multi-bit cell pages having a plurality of multi-bit cell page buffers, the plurality of multi-bit cell bit lines being coupled to the plurality of multi-bit cell page buffers.

2. A nonvolatile memory as recited in claim 1 further comprising a row address detector configured to determine which of the single bit cell array and the multi-bit cell array will receive a received a particular row address.

3. A nonvolatile memory as recited in claim 2 wherein said row address detector is integral with the nonvolatile memory.

4. A nonvolatile memory as recited in claim 2 wherein said row address detector is external to the nonvolatile memory.

5. A nonvolatile memory as recited in claim 1 including a single bit timing controller coupled to the row address detector for controlling the single-bit cell array.

6. A nonvolatile memory as recited in claim 5 including a multi-bit timing controller coupled to the row address detector for controlling the multi-bit cell array.

7. A nonvolatile memory, comprising:
    a plurality of input/output lines;
    a single bit cell array having a plurality of single-bit cell bit lines and a plurality of single-bit cell memory blocks, each single-bit cell memory block coupled to a respective input/output line and being divided into a plurality of single-bit cell pages having a plurality of single-bit cell page buffers, the plurality of single-bit cell bit lines being coupled to the plurality of single-bit cell page buffers; and
    a multi-bit cell array having a plurality of multi-bit cell bit lines and a plurality of multi-bit cell memory blocks, each multi-bit cell memory block coupled to at least one respective input/output lines and being divided into a plurality of multi-bit cell pages having a plurality of multi-bit cell page buffers, the plurality of multi-bit cell bit lines being coupled to the plurality of multi-bit cell page buffers; and
    a timing controller coupled to the single bit and multi bit cell arrays for generating control signals necessary to arrange processing operations in the plurality of single-bit and multi-bit page buffers.

8. A nonvolatile memory as recited in claim 7 including a row address detector configured to determine which of the single bit cell array and the multi-bit cell array will receive a received a particular row address.

9. A nonvolatile memory as recited in claim 8 wherein said row address detector is integral with the nonvolatile memory.

10. A nonvolatile memory as recited in claim 8 wherein the row address detector is external to the nonvolatile memory.

11. A method for operating a nonvolatile memory, comprising the steps of:
    a row address detector receiving from a row address buffer a memory address which is located in one of a single bit cell array and a multi-bit cell array which are formed on a single substrate;
    the row address detector determining whether the address is in one of the single bit cell array and the multi-bit cell array;
    the row address detector processing a signal to one of a single bit timing controller and a multi-bit timing controller to access one of the single bit array and the multi-bit array.

* * * * *